(12) United States Patent
Boenapalli et al.

(10) Patent No.: US 10,410,730 B1
(45) Date of Patent: Sep. 10, 2019

(54) SELECTIVELY SYNCHRONIZING FLASH MEMORY BLOCK REFRESHES BASED IN PART UPON MEMORY BLOCK TEMPERATURE

(71) Applicant: QUALCOMM Incorporated, San Diego, CA (US)

(72) Inventors: Madhu Yashwanth Boenapalli, Hyderabad (IN); Surendra Paravada, Hyderabad (IN); Sai Praneeth Sreeram, Anantapur (IN); Venu Madhav Mokkapati, Hyderabad (IN)

(73) Assignee: QUALCOMM Incorporated, San Diego, CA (US)

(*) Notice: Subject to any disclaimer, the term of this patent is extended or adjusted under 35 U.S.C. 154(b) by 48 days.

(21) Appl. No.: 15/942,380

(22) Filed: Mar. 30, 2018

(51) Int. Cl.
| | |
|---|---|
| *G06F 12/00* | (2006.01) |
| *G11C 16/34* | (2006.01) |
| *G06F 11/10* | (2006.01) |
| *G11C 29/52* | (2006.01) |
| *G06F 3/06* | (2006.01) |
| *G11C 16/32* | (2006.01) |
| *G06F 12/02* | (2006.01) |

(52) U.S. Cl.
CPC ........ *G11C 16/3431* (2013.01); *G06F 3/0619* (2013.01); *G06F 3/0653* (2013.01); *G06F 3/0679* (2013.01); *G06F 11/1068* (2013.01); *G06F 12/0246* (2013.01); *G11C 16/32* (2013.01); *G11C 29/52* (2013.01); *G06F 2212/72* (2013.01)

(58) Field of Classification Search
CPC ............. G06F 12/0246; G06F 2212/72; G06F 3/0619; G06F 3/0653; G06F 3/0679; G06F 11/1068; G11C 16/3431; G11C 16/32; G11C 29/52
See application file for complete search history.

(56) References Cited

U.S. PATENT DOCUMENTS

| | | | |
|---|---|---|---|
| 8,248,831 B2 | 8/2012 | Rotbard et al. | |
| 8,619,485 B2 | 12/2013 | Klein | |
| 9,633,711 B2 | 4/2017 | Cho et al. | |
| 9,640,242 B1* | 5/2017 | Lo | G11C 11/40618 |
| 2015/0085594 A1* | 3/2015 | Dong | G11C 11/40626 365/222 |
| 2017/0110177 A1 | 4/2017 | Lee et al. | |
| 2017/0255403 A1 | 9/2017 | Sharon et al. | |

* cited by examiner

*Primary Examiner* — Shawn X Gu
(74) *Attorney, Agent, or Firm* — Muncy, Geissler, Olds & Lowe, P.C.

(57) ABSTRACT

An embodiment is directed to an apparatus that comprises a host controller and a flash memory. The host controller monitors a temperature in a first memory block of the flash memory (e.g., based on a reported temperature measurements from the flash memory), and selectively synchronizes a first refresh of the first memory block with a second refresh of a second memory block of the flash memory based in part upon the monitored temperature. For example, an immediate refresh of the first memory block may be performed if there is a pending I/O request for the first memory block, an error rate associated with the first memory block exceeds an error rate threshold and/or the monitored temperature of the first memory block exceeds a temperature threshold; otherwise, a synchronized refresh of the first and second memory blocks may be executed.

30 Claims, 11 Drawing Sheets

SELECTIVELY SYNCHRONIZING FLASH MEMORY BLOCK REFRESHES BASED IN PART UPON MEMORY BLOCK TEMPERATURE

TECHNICAL FIELD

Embodiments relate to selectively synchronizing flash memory block refreshes based in part upon memory block temperature.

BACKGROUND

Electronic devices (e.g., cell phones, laptop computers, tablet computers, etc.) may use flash memory to store data. Flash memory is a type of non-volatile memory that retains stored data even when no power is applied to the memory. Over time, data errors may occur in flash memory due to various factors, including aging, temperature fluctuations, charge loss, and so on. Refresh operations are performed on the flash memory to correct these data errors. In flash memory, a refresh operation involves reading all the data from one particular memory block, correcting any errors in the read data, and then rewriting the corrected data (e.g., back into the same memory block or a different memory block).

One type of data error that may occur in flash memory is a bit-flip error (shown in Table 1, below) is an unintentional state switch (e.g., from 0 to 1, or from 1 to 0) for a particular memory bit. In NAND flash memory, bit-flip errors may occur due to manufacturing defects during ionizations, high strain on memory cells caused by read operations, and/or charge loss.

TABLE 1

Bit-Flip Error Example

| Address Location | Correct Data Byte | Corrupted Data Byte | Remarks |
| --- | --- | --- | --- |
| 0x0000 | 0x02 (binary = 0000 0010) | 0x00 (binary = 0000 0000) | $2^{nd}$ data bit (from right) is flipped from 1 to 0 |
| 0x0080 | 0xB4 (binary = 1011 0100) | 0x80 (binary = 1000 0000) | $3^{rd}$, $5^{th}$ and $6^{th}$ bits (from right) are flipped from 1 to 0 |

Another type of data error that may occur in flash memory is a transmission error, which is an error that occurs in association with the communication of data between the flash memory and a host controller. An error correction code (ECC) process is conventionally used to address transmission errors. The ECC process includes adding redundant data, or parity data, to a message, such that the message can be recovered by a receiver (host controller or flash memory) even when a number of errors (up to a particular error threshold that is based on a capability of the ECC being used) is introduced, either during the process of transmission or on storage.

BRIEF DESCRIPTION OF THE DRAWINGS

A more complete appreciation of embodiments of the disclosure will be readily obtained as the same becomes better understood by reference to the following detailed description when considered in connection with the accompanying drawings, which are presented solely for illustration and not limitation of the disclosure, and in which.

SUMMARY

An embodiment is directed to a method of operating a host controller for a flash memory, including monitoring a temperature in a first memory block of the flash memory, and selectively synchronizing a first refresh of the first memory block with a second refresh of a second memory block of the flash memory based in part upon the monitored temperature.

Another embodiment is directed to an apparatus, including a host controller configured to operate a flash memory via a memory bus, the host controller configured to monitor a temperature in a first memory block of the flash memory, and selectively synchronize a first refresh of the first memory block with a second refresh of a second memory block of the flash memory based in part upon the monitored temperature.

Another embodiment is directed to a method of operating a host controller for a flash memory, including measuring a temperature in a first memory block of the flash memory, reporting the measured temperature of the flash memory to a host controller via a memory bus, and selectively executing synchronized refreshes of the first memory block and a second memory block of the flash memory based in part upon the reported temperature.

Another embodiment is directed to an apparatus, including a flash memory configured to communicate with a host controller via a memory bus, the flash memory configured to measure a temperature in a first memory block of the flash memory, report the measured temperature of the flash memory to the host controller via the memory bus, and selectively execute synchronized refreshes of the first memory block and a second memory block of the flash memory based in part upon the reported temperature.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. Nevertheless, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Figure 1:
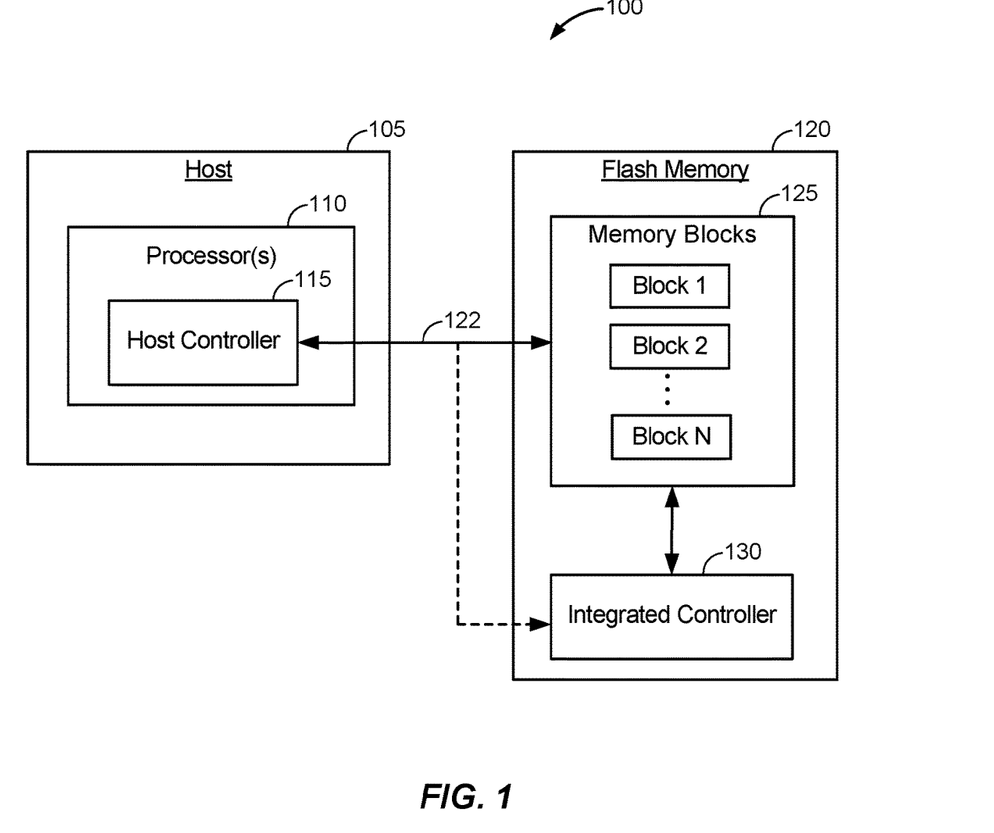
FIG. 1 illustrates a flash memory system in accordance with an embodiment of the disclosure.

FIG. 1 illustrates a flash memory system 100 in accordance with an embodiment of the disclosure. The flash memory system 100 may be integrated in an electronics device, such as a UE or a server. Referring to FIG. 1, the flash memory system 100 includes a host system 105 including at least one processor 110. The at least one processor 110 includes a host controller 115. The host controller 115 is configured to control a flash memory 120 via a memory bus 122. In an example, the memory bus 122 may be a die-to-die bus. The flash memory 120 includes memory blocks 125, or blocks 1 . . . N. The flash memory 120 further includes an integrated controller 130. In an example, the components depicted in FIG. 1 may be integrated as part of an electronics device, such as the electronics device 1000 which is described in more detail below with respect to FIG. 10.

The flash memory 120 may be configured for operation in accordance with either a self-refresh mode or a host-driven refresh mode. In the self-refresh mode, refreshes are scheduled by the integrated controller 130 without direct involvement by the host controller 115. In the host-driven refresh mode, refreshes are scheduled by the host controller 115.

During operation in accordance with the host-driven refresh mode, memory blocks are refreshed at a periodic interval. However, certain triggering events may cause the host controller 115 to perform an immediate refresh of certain memory blocks (i.e., in advance of their next scheduled periodic interval). For example, when an error rate associated with a particular memory block is too high (e.g., above the ECC error rate threshold, etc.), the host controller 115 may schedule an immediate refresh of the memory block. The host controller 115 may also schedule an immediate refresh of the memory block based on other factors, such as when a pending input or output (I/O) request is detected for the memory block (e.g., based on detection of performance votes).

Before a refresh can be performed on a memory block, a certain pre-configuration time is required for the memory block. In an example, the pre-configuration time can be the same for all refresh operations, and may be predetermined by the host controller 115. In a further example, the pre-configuration time may be used by the host controller 115 to gather information related to the cells undergoing a refresh. In embodiments of the disclosure to be described in more detail below, the information gathered during the pre-configuration time may include parameters such as block-specific temperature feedback, performance votes (e.g., whether an I/O request is pending for a cell in a particular memory block), and so on. As used herein, a "memory block" refers to a unit of memory that shares a common pre-configuration time at a respective scheduler (e.g., the host controller 115 during host-driven refresh mode, or the integrated controller 130 during self-refresh mode). For example, in a NAND flash memory, a memory page may correspond to a NAND memory block (e.g., 64 NAND pages together may constitute a NAND memory block in certain NAND flash memory devices). In some applications, the duration of each memory block's pre-configuration time may be the same, although this is not strictly necessary.

Figure 2:
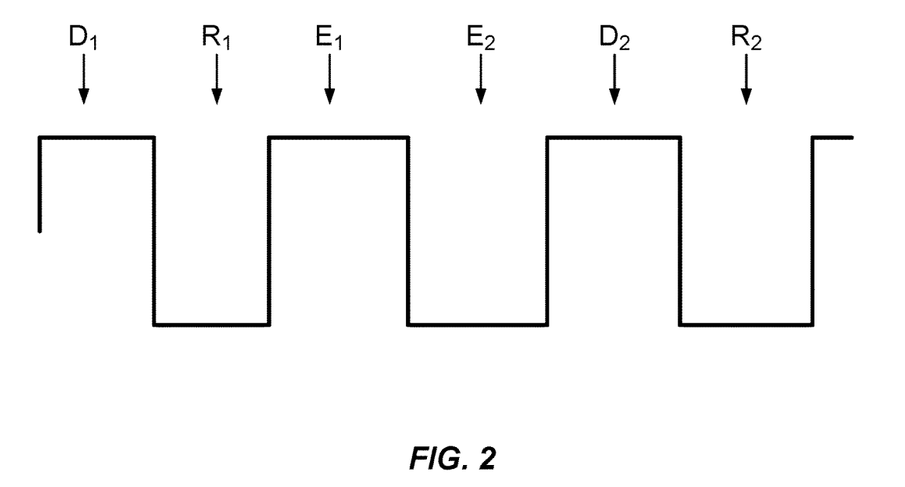
FIG. 2 illustrates a memory operation sequence in accordance with an embodiment of the disclosure.

FIG. 2 illustrates a memory operation sequence in accordance with an embodiment of the disclosure. Referring to FIG. 2, the memory operation sequence is shown relative to a clock signal to emphasize the number of clock cycles that elapse during the memory operation sequence. In FIG. 2, assume that the flash memory system 100 is operating in accordance with a host-driven refresh mode.

Referring to FIG. 2, the host controller 115 schedules a block 1 refresh ($R_1$) after a pre-configuration time for block 1 ($D_1$). After $R_1$, an I/O operation is performed on block 1 ($E_1$). After $E_1$, an I/O operation is performed on block 2 ($E_2$). After $E_2$, the host controller 115 schedules a block 2 refresh ($R_2$) after a pre-configuration time for block 2 ($D_2$). Assuming that $D_1$=$D_2$, then the total time elapsed during the memory operation sequence of FIG. 2 is $E_1$+$E_2$+$R_1$+$R_2$+$2D_1$.

Figure 3:
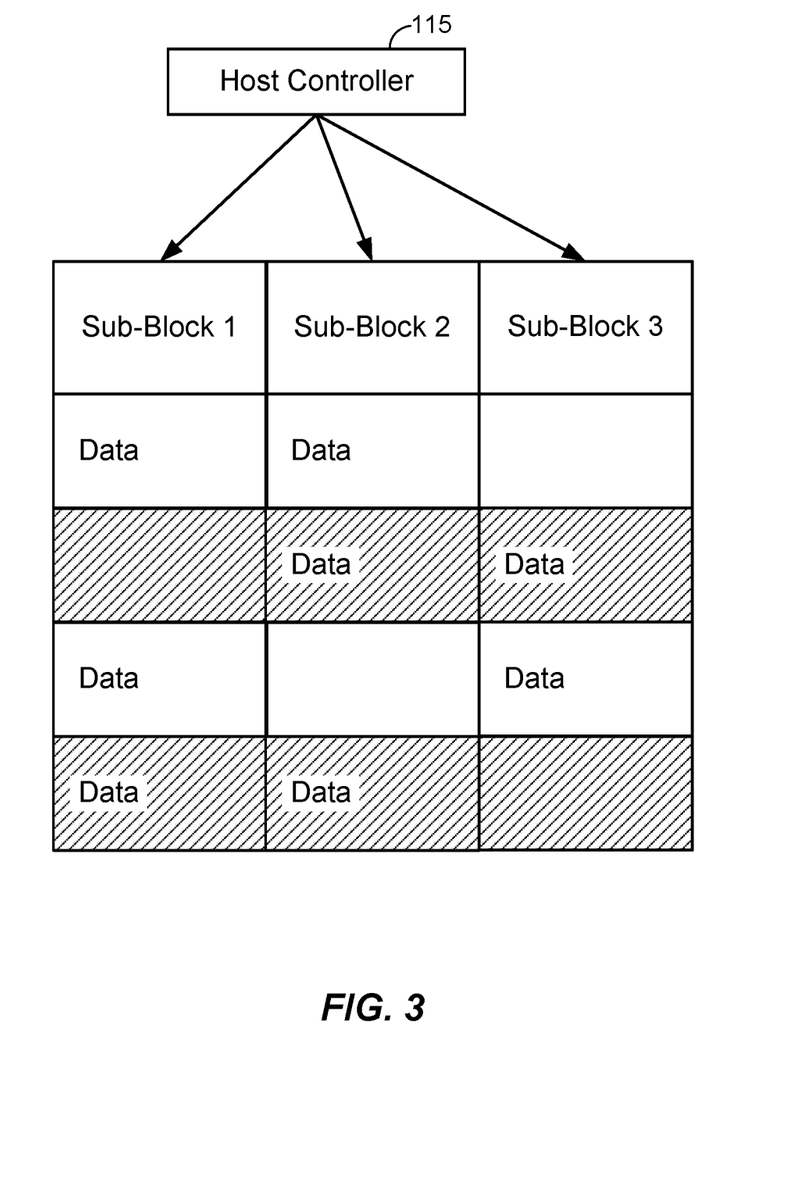
FIG. 3 illustrates sub-blocks from a memory block of FIG. 1 in accordance with an embodiment of the disclosure.

FIG. 3 illustrates sub-blocks 1, 2 and 3 from block 1 of the memory blocks 125 of FIG. 1 in accordance with an embodiment of the disclosure. Referring to FIG. 3, the pre-configuration time triggers individually for each particular memory block undergoing a refresh. Hence, sub-blocks 1-3 each undergo a pre-configuration time ($D_1$) in association with a block 1 refresh ($R_1$), sub-blocks of block 2 (not shown) undergo another pre-configuration time ($D_2$) in association with a block 2 refresh ($R_2$), and so on. None of the pre-configuration times for different memory blocks are synchronized, and as such the pre-configuration time for each memory block adds delay to the operation of the flash memory system 100.

Figure 4:
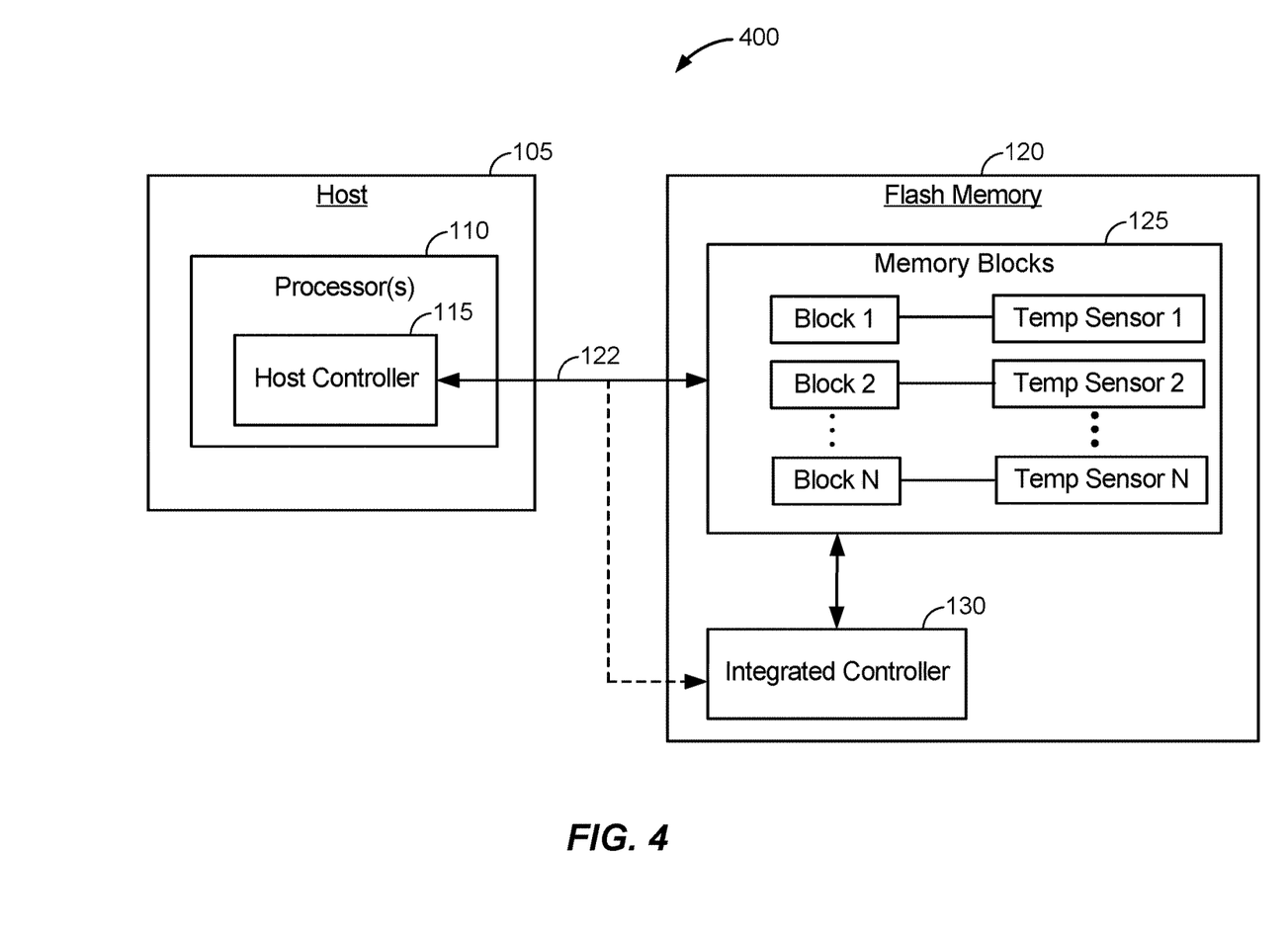
FIG. 4 illustrates a flash memory system in accordance with another embodiment of the disclosure.

FIG. 4 illustrates a flash memory system 400 in accordance with another embodiment of the disclosure. The flash memory system 400 of FIG. 4 is configured similarly to the flash memory system 100 of FIG. 1, except that the flash memory system 400 further includes temperature sensors 1 . . . N which are configured to monitor temperatures in blocks 1 . . . N, respectively. The flash memory system 400 may be integrated in an electronics device, such as a UE or a server. In an example, the components depicted in FIG. 4 may be integrated as part of an electronics device, such as the electronics device 1000 which is described in more detail below with respect to FIG. 10.

Referring to FIG. 4, in an example, the flash memory system 400 may be deployed as a memory component of a larger apparatus that incorporates the flash memory system 400 (i.e., the host controller 105, the flash memory 120 and the memory bus 122), including but not limited to a computing device, a mobile computing device, a vehicle, an augmented reality (AR) system, and/or a virtual reality (VR) system.

Figure 5A:
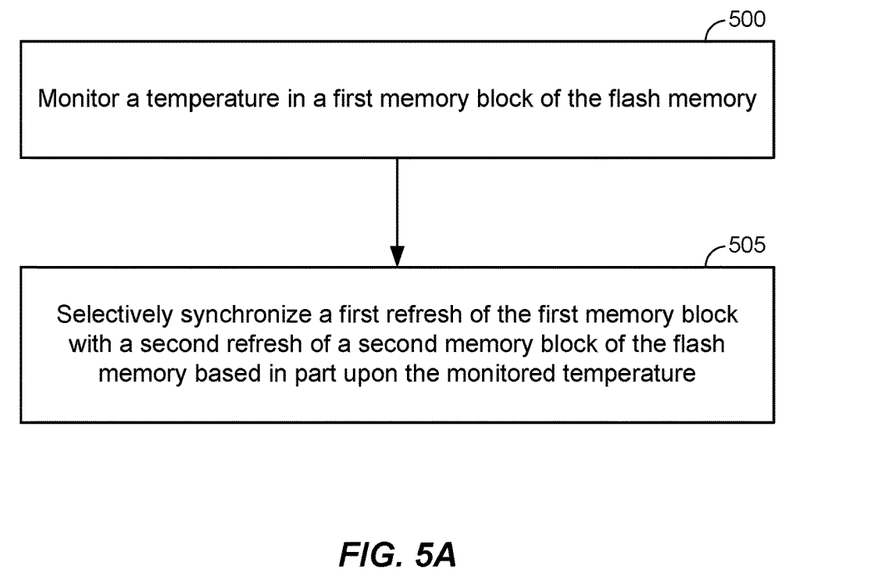
FIG. 5A illustrates a refresh scheduling procedure in accordance with an embodiment of the disclosure.

FIG. 5A illustrates a refresh scheduling procedure in accordance with an embodiment of the disclosure. In an example, the refresh scheduling procedure of FIG. 5A may be performed by the host controller 115 in the flash memory system 400 of FIG. 4.

Referring to FIG. 5A, at block 500, the host controller 115 monitors a temperature in a first memory block of the flash memory 120. At block 505, the host controller 115 selectively synchronizes a first refresh of the first memory block (e.g., block 1) with a second refresh of a second memory block (e.g., block 2) of the flash memory 120 based in part upon the monitored temperature. As will be described in more detail, the selective synchronization of block 505 may be based on the monitored temperature of the first memory block as well as secondary parameters (e.g., whether there are any pending I/O requests for the first memory block, an error rate of the first memory block, etc.).

Referring to FIG. 5A, one manner in which the selective synchronization of block 505 may synchronize the first and second refreshes of the first and second memory blocks is by delaying a startpoint of a first pre-configuration time for the first refresh so as to be aligned with a startpoint of a second pre-configuration time for the second refresh, causing the two pre-configuration times to overlap. The overlapped pre-configuration times may be referred to as a common pre-configuration time.

Figure 5B:
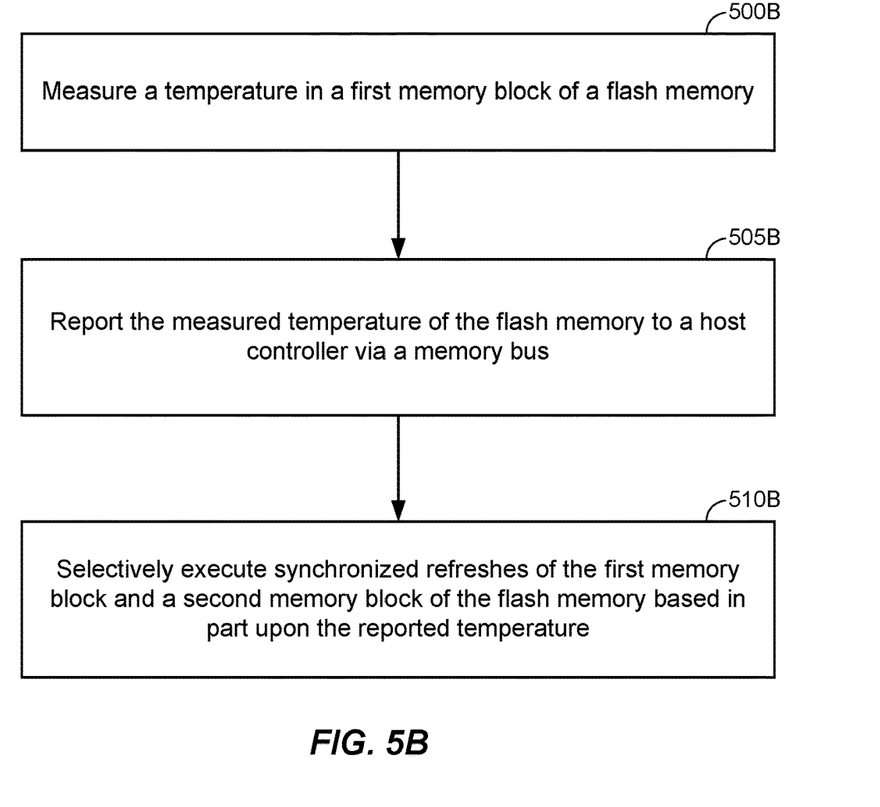
FIG. 5B illustrates a refresh execution procedure in accordance with an embodiment of the disclosure.

FIG. 5B illustrates a refresh execution procedure in accordance with an embodiment of the disclosure. In an example, the refresh execution procedure of FIG. 5B may be performed by the flash memory 120 in the flash memory system 400 of FIG. 4.

Referring to FIG. 5B, at block 500B, the flash memory 120 measures a temperature in a first memory block of the flash memory 120. For example, the temperature measurement of block 500B may be performed by any of temperature sensors 1 . . . N. At block 505B (e.g., as in block 500 of FIG. 5A), the flash memory 120 reports the measured temperature to the host controller 115 (e.g., via memory bus 122). At block 510B (e.g., based on the scheduling at block 505 of FIG. 5A), the flash memory 120 selectively executes synchronized refreshes of the first memory block (e.g., block 1) and a second memory block (e.g., block 2) of the flash memory 120 based in part upon the reported temperature from block 505B.

Figure 6:
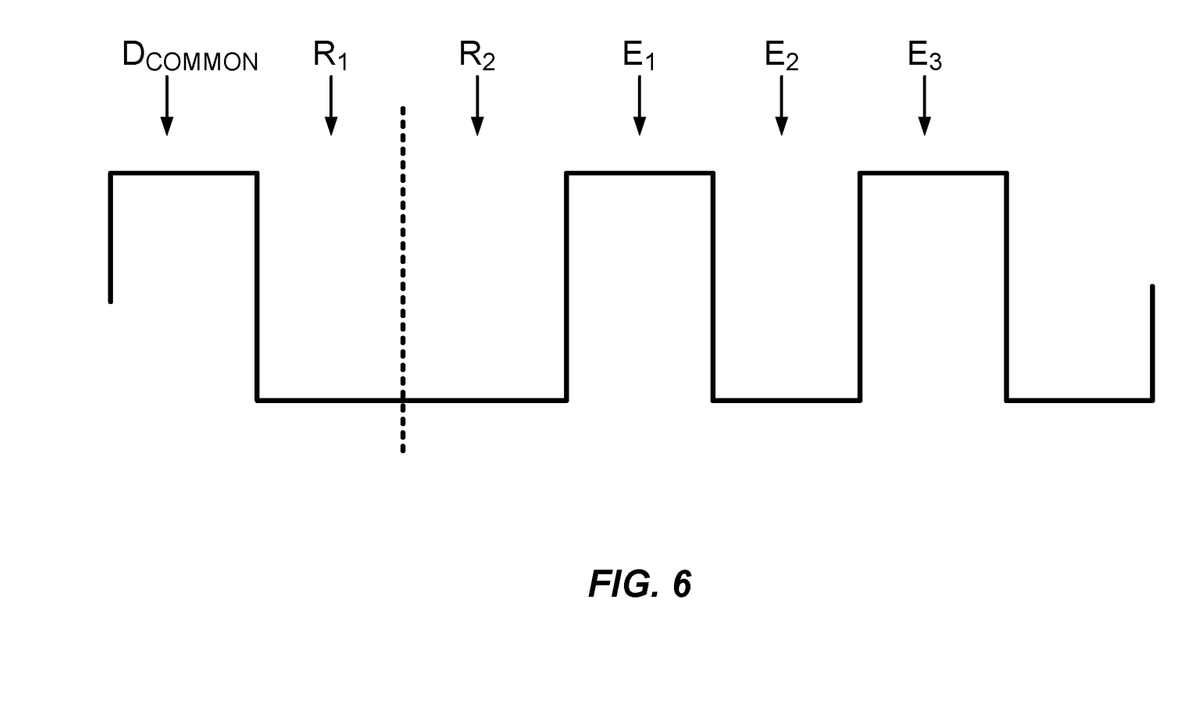
FIG. 6 illustrates a memory operation sequence in accordance with another embodiment of the disclosure.

FIG. 6 illustrates a memory operation sequence in accordance with another embodiment of the disclosure. Referring to FIG. 6, the memory operation sequence is shown relative to a clock signal to emphasize the number of clock cycles that elapse during the memory operation sequence. In FIG. 6, assume that the flash memory system 400 is operating in accordance with a host-driven refresh mode.

Referring to FIG. 6, assume that the processes of FIGS. 5A-5B has executed, with the host controller 115 determining to synchronize refreshes of blocks 1 and 2 at block 505. Under this assumption, the host controller 115 delays a startpoint of a first pre-configuration time ($D_1$) for block 1 so as to be aligned with a startpoint of a second pre-configuration time ($D_2$) for block 2. This merged (or aligned) pre-configuration time is denoted in FIG. 6 as $D_{COMMON}$. After $D_{COMMON}$, the host controller 115 schedules a block 1 refresh ($R_1$) followed directly by a block 2 refresh ($R_2$). So, $R_1$ and $R_2$ are performed back-to-back without an intervening pre-configuration time being required. After $R_2$, an I/O operation is performed on block 1 ($E_1$). After $E_1$, an I/O operation is performed on block 2 ($E_2$). After $E_2$, an I/O operation is performed on block 3 ($E_3$). Assuming that $D_1=D_2=D_{COMMON}$, then the total time elapsed during the memory operation sequence of FIG. 6 is $E_1+E_2+E_3+R_1+R_2+D_1$. Hence, relative to the memory operation sequence of FIG. 2, the memory operation sequence of FIG. 6 is more efficient because an additional I/O operation ($E_3$) is executed by virtue of the time savings from the synchronization of refreshes $R_1$-$R_2$ due to the pre-configuration time overlap ($D_{COMMON}$).

Figure 7:
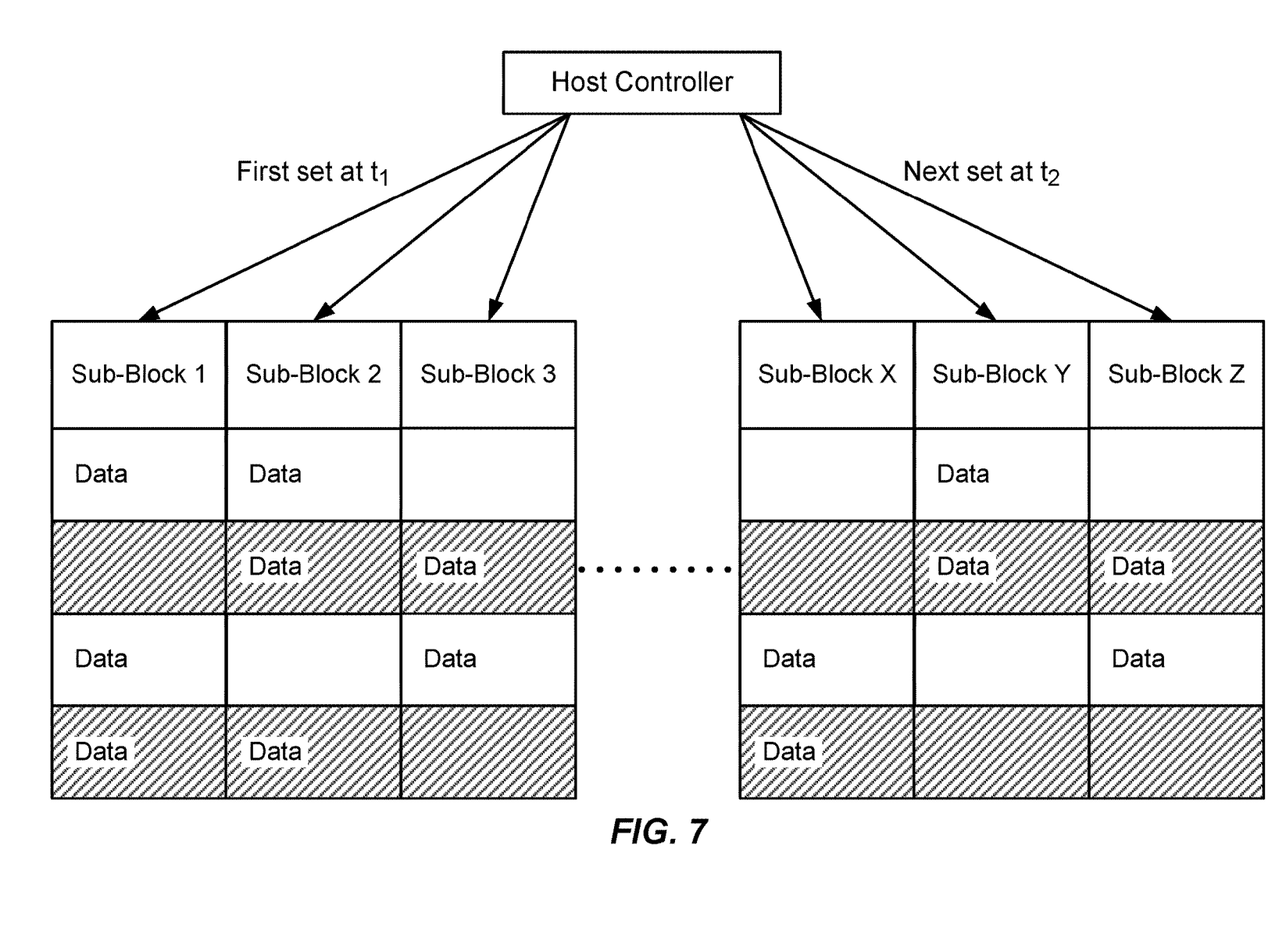
FIG. 7 illustrates sets of sub-blocks from memory blocks of FIG. 4 in accordance with an embodiment of the disclosure.

FIG. 7 illustrates sets of sub-blocks from the memory blocks 125 of FIG. 4 in accordance with an embodiment of the disclosure. Referring to FIG. 7, sub-blocks 1, 2 and 3 may correspond to block 1 from FIG. 4, and sub-blocks x, y and z may correspond to block 2 from FIG. 4. Conventionally, pre-configuration times of sub-blocks 1, 2, 3 and sub-blocks x, y, z would be scheduled separately (e.g., at $t_1$ and $t_2$, respectively). However, in various embodiments of the disclosure, the refreshes of blocks 1, 2, 3 and sub-blocks x, y, z can be synchronized with each other by sharing a common pre-configuration time (or $D_{COMMON}$).

Figure 8:
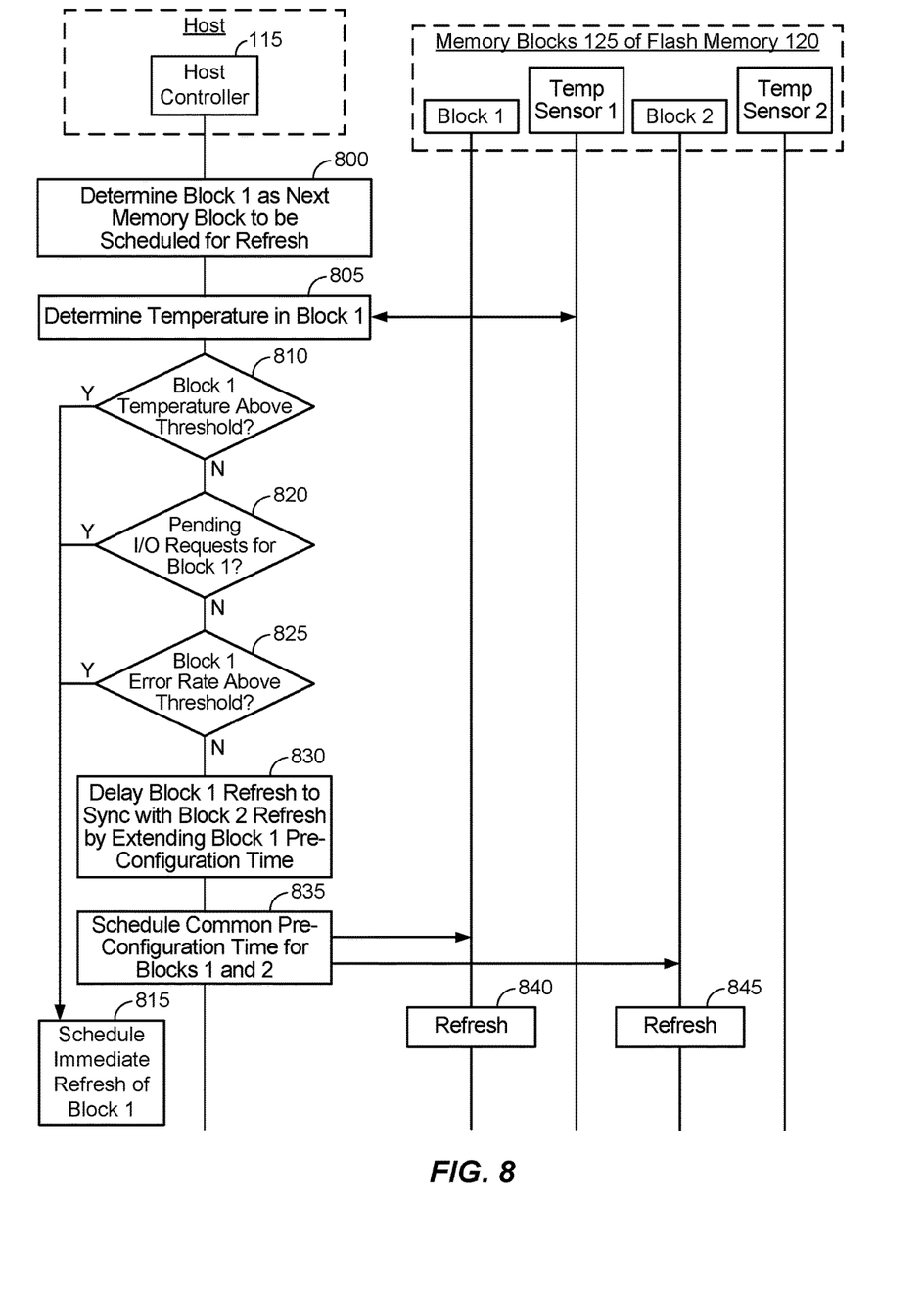
FIG. 8 illustrates an example implementation of the process of FIGS. 5A-5B by the flash memory system of FIG. 4 in accordance with an embodiment of the disclosure.

FIG. 8 illustrates an example implementation of the processes of FIGS. 5A-5B by the flash memory system 400 of FIG. 4 in accordance with an embodiment of the disclosure. In FIG. 8, the flash memory system 400 is operating in accordance with a host-driven refresh mode.

Referring to FIG. 8, at block 800, the host controller 115 determines that block 1 is the next memory block for a refresh. Instead of immediately performing the refresh on block 1, the host controller 115 first evaluates a number of parameters to determine if synchronization of the block 1 refresh with refresh(es) of one or more other memory blocks 125 is possible.

Referring to FIG. 8, at block 805 (e.g., as in block 500 of FIG. 5A or blocks 500B-505B of FIG. 5B), the host controller 115 determines a temperature in block 1 based on feedback from temperature sensor 1. At block 810, the host controller 115 determines whether the temperature in block 1 is above a temperature threshold. For example, the temperature threshold may be established such that data corruption is expected to occur in memory blocks operating at a temperature that exceeds the temperature threshold. If the host controller 115 determines that the temperature in block 1 is above the temperature threshold at block 810, then the process advances to block 815, whereby the host controller 115 schedules an immediate refresh of block 1 without attempting to synchronize the block 1 refresh with a refresh of block 2. Otherwise, the process advances to block 820.

Referring to FIG. 8, at block 820, the host controller 115 determines whether there are any pending I/O requests for block 1. For example, the host controller 115 may check with a file system to determine if any performance votes are granted for block 1 as part of the determination of block 820. If the host controller 115 determines that there are one or more pending I/O requests for block 1 at block 820, then the process advances to block 815, whereby the host controller 115 schedules an immediate refresh of block 1 without attempting to synchronize the block 1 refresh with a refresh of block 2. Otherwise, the process advances to block 825.

Referring to FIG. 8, at block 825, the host controller 115 determines whether the error rate associated with block 1 is above an error rate threshold (e.g., above an error rate threshold that is established based on an ECC protocol used for data being exchanged between the host controller 115 and the flash memory 120). If the host controller 115 determines that the error rate associated with block 1 is above the error rate threshold at block 825, then the process advances to block 815, whereby the host controller 115 schedules an immediate refresh of block 1 without attempting to synchronize the block 1 refresh with a refresh of block 2. Otherwise, the process advances to block 830.

Referring to FIG. 8, at block 830, the host controller 115 delays the block 1 refresh to synchronize the block 1 refresh with a block 2 refresh by extending the startpoint of block 1's pre-configuration time. At block 835, the host controller 115 schedules a common pre-configuration time that is shared by both blocks 1 and 2. After the common pre-configuration time, blocks 1 and 2 perform their respective refreshes at blocks 840-845 (e.g., as in block 510B of FIG. 5B). Blocks 835-845 may correspond to $D_{COMMON}$, $R_1$ and $R_2$ from FIG. 6, in an example. Also, blocks 810-835 generally correspond to an example implementation of block 505 of FIG. 5A.

Figure 9A:
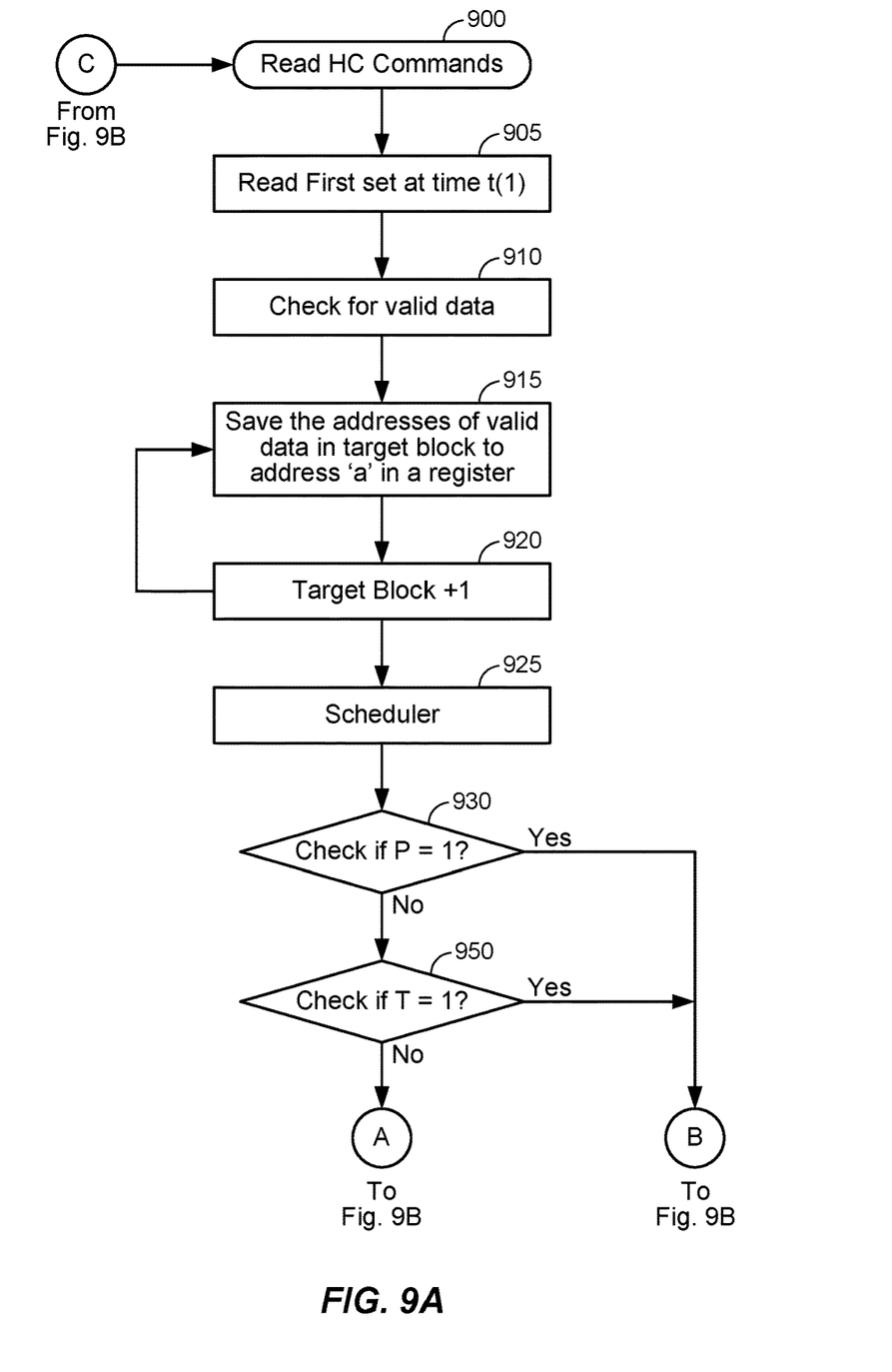
FIGS. 9A-9B illustrate another example implementation of the process of FIGS. 5A-5B in accordance with an embodiment of the disclosure.
Figure 9B:
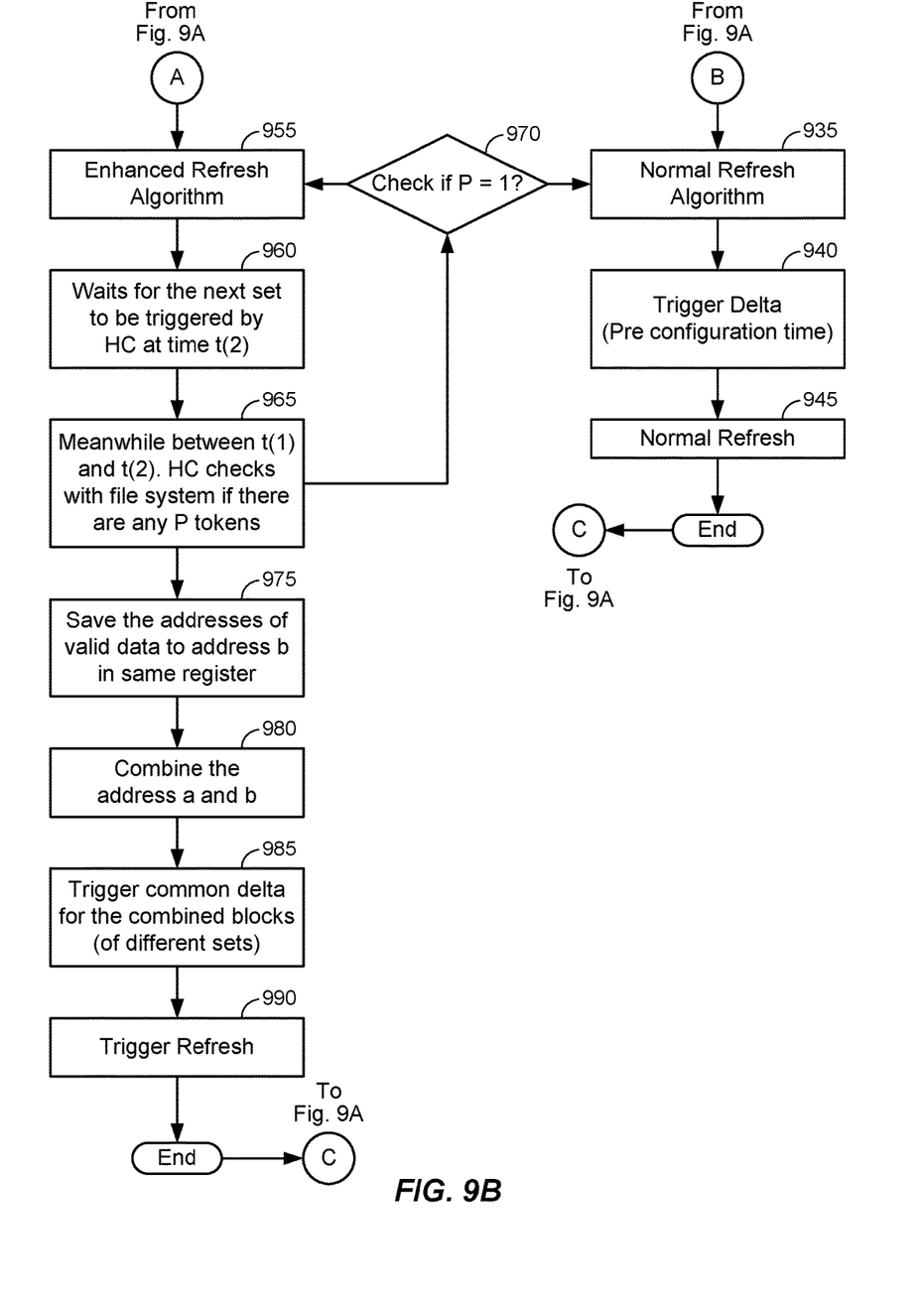

FIGS. 9A-9B illustrate another example implementation of the processes of FIGS. 5A-5B in accordance with an embodiment of the disclosure. The process of FIGS. 9A-9B is performed by the host controller 115 while the flash memory system 400 is operating in accordance with a host-driven refresh mode.

Referring to FIGS. 9A-9B, at block 900, the host controller 115 reads commands arriving at the host controller 115 from the file system, which are referred to herein as "HC" commands. At block 905, the host controller 115 reads a first target memory block at $t_1$. At block 910, the host controller 115 checks for valid data in a first sub-block of the first target memory block. At block 915, the host controller 115 saves the addresses of valid data in the first sub-block to address 'a' in a register. At block 920, the sub-block is incremented, and the process returns to block 915 until the data from each sub-block is read and stored in the register. At block 925, a scheduler at the host controller 115 is loaded. The scheduler being loaded at block 925 is a transition point between implemented of a traditional or 'normal' refresh algorithm (e.g., an immediate or non-synced refresh of a memory block, as shown at blocks 935-945) and an 'enhanced' refresh algorithm (e.g., an inter-block synced refresh, as shown between blocks 955-990).

Referring to FIGS. 9A-9B, at block 930, the host controller 115 determines whether there are any performance votes (denoted as P=1) for the first target memory block. If so, then the host controller 115 does not delay the refresh of the first target memory block, and instead engages a normal or default refresh algorithm at block 935, with a pre-configuration time being implemented at block 940, followed by a refresh of the first target memory block at block 945. Otherwise, the process advances to block 950.

Referring to FIGS. 9A-9B, at block 950, the host controller 115 determines whether a temperature in the first target memory block is above a temperature threshold (denoted as T=1). If so, then the host controller 115 does not delay the refresh of the first target memory block, and instead engages a normal or default refresh algorithm at block 935, with a pre-configuration time being implemented at block 940, followed by a refresh of the first target memory block at block 945. Otherwise, the process advances to block 955.

Referring to FIGS. 9A-9B, at block 955, the host controller 115 determines to execute an 'enhanced' refresh algorithm for refreshing the first target memory block. In other words, the host controller 115 determines to delay the refresh of the first target memory block for synchronization with the refresh of another memory block. Accordingly, at block 960, the host controller 115 waits for a refresh of a second target memory block to be triggered at time $t_2$. During this wait period between $t_i$ and $t_2$, the host controller 115 may periodically check with the file system to determine if there are any performance tokens (or performance votes) granted for the first target memory block at block 965. If the host controller 115 determines that there are no performance votes for the first target memory block at block 970, the host controller 115 continues to wait for $t_2$ without performing a refresh on the first target memory block. Otherwise, if the host controller 115 determines that at least one performance vote is granted for the target first k at block 970, the host controller 115 performs an immediate refresh on the first target memory block between blocks 935-945.

Referring to FIGS. 9A-9B, at block 975, the host controller 115 reads the data from each sub-block in the second target memory block at time $t_2$, and saves the addresses of valid data to an address 'b' in the same register. At block 980, the addresses a and b in the register are combined. At block 985, a common pre-configuration time, or $D_{COMMON}$, is triggered for the first and second target memory blocks, followed by refreshes of the first and second target memory blocks at block 990.

Figure 10:
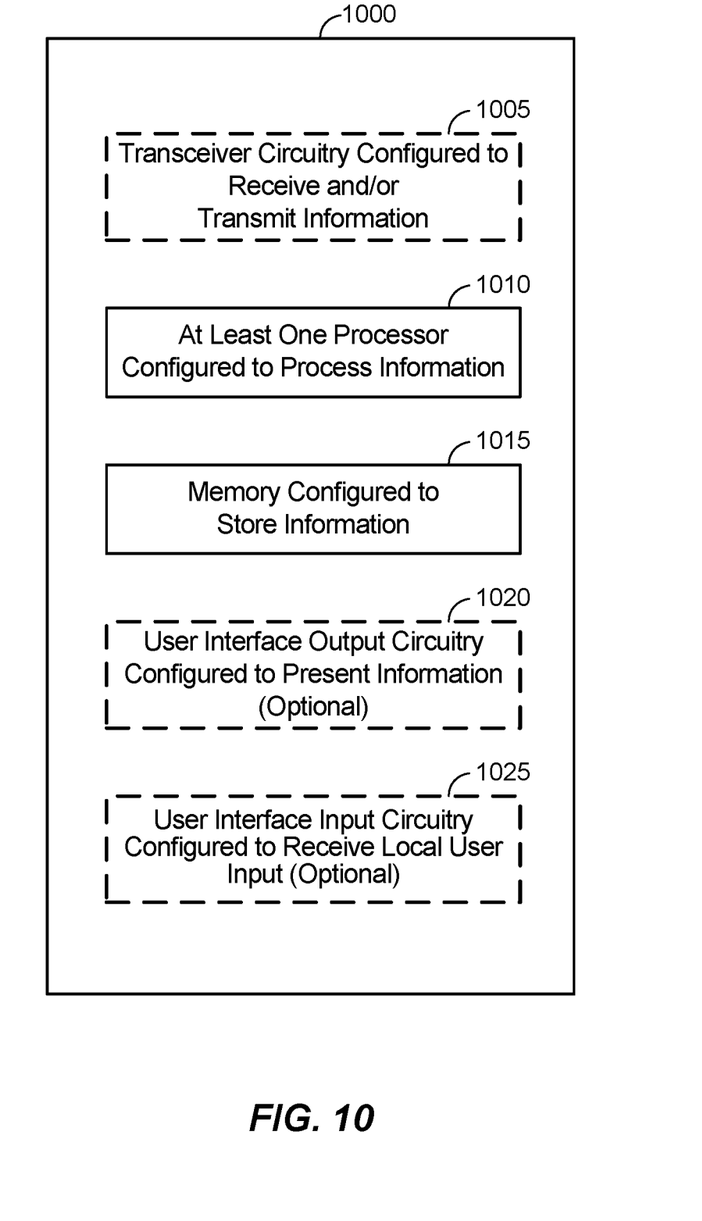
FIG. 10 illustrates an electronics device that includes structural components in accordance with an embodiment of the disclosure.

FIG. 10 illustrates an electronics device 1000 that includes structural components in accordance with an embodiment of the disclosure. In an example, the electronics device 1000 can include the flash memory system 400 of FIG. 4.

Referring to FIG. 10, the electronics device 1000 optionally includes transceiver circuitry configured to receive and/or transmit information 1005. In an example, if the electronics device 1000 corresponds to a wireless communications device (e.g., a user equipment such as a smart phone or tablet computer, a laptop or desktop computer, etc.), the transceiver circuitry configured to receive and/or transmit information 1005 can include a wireless communications interface (e.g., Bluetooth, Wi-Fi, Wi-Fi Direct, Long-Term Evolution (LTE) Direct, etc.) such as a wireless transceiver and associated hardware (e.g., an RF antenna, a MODEM, a modulator and/or demodulator, etc.). In another example, the transceiver circuitry configured to receive and/or transmit information 1005 can correspond to a wired communications interface (e.g., a serial connection, a USB or Firewire connection, an Ethernet connection through which the Internet can be accessed, etc.). Thus, if the electronics device 1000 corresponds to some type of network-based server (e.g., an application server), the transceiver circuitry configured to receive and/or transmit information 1005 can correspond to an Ethernet card, in an example, that connects the network-based server to other communication entities via an Ethernet protocol. In a further example, the transceiver circuitry configured to receive and/or transmit information 1005 can include sensory or measurement hardware by which the electronics device 1000 can monitor its local environment (e.g., an accelerometer, a temperature sensor, a light sensor, an antenna for monitoring local RF signals, etc.). The transceiver circuitry configured to receive and/or transmit information 1005 can also include software that, when executed, permits the associated hardware of the transceiver circuitry configured to receive and/or transmit information 1005 to perform its reception and/or transmission function(s). However, the transceiver circuitry configured to receive and/or transmit information 1005 does not correspond to software alone, and the transceiver circuitry configured to receive and/or transmit information 1005 relies at least in part upon structural hardware to achieve its functionality. Moreover, the transceiver circuitry configured to receive and/or transmit information 1005 may be implicated by language other than "receive" and "transmit", so long as the underlying function corresponds to a receive or transmit function. For an example, functions such as obtaining, acquiring, retrieving, measuring, etc., may be performed by the transceiver circuitry configured to receive and/or transmit information 1005 in certain contexts as being specific types of receive functions. In another example, functions such as sending, delivering, conveying, forwarding, etc., may be performed by the transceiver circuitry configured to receive and/or transmit information 1005 in certain contexts as being specific types of transmit functions. Other functions that correspond to other types of receive and/or transmit functions may also be performed by the transceiver circuitry configured to receive and/or transmit information 1005.

Referring to FIG. 10, the electronics device 1000 further includes at least one processor configured to process information 1010 (e.g., the host controller 115) Example implementations of the type of processing that can be performed by the at least one processor configured to process information 1010 includes but is not limited to performing determinations, establishing connections, making selections between different information options, performing evaluations related to data, interacting with sensors coupled to the electronics device 1000 to perform measurement operations, converting information from one format to another (e.g., between different protocols such as .wmv to .avi, etc.), and so on. For example, the at least one processor configured to process information 1010 can include a general purpose processor, a DSP, an ASIC, a field programmable gate array (FPGA) or other programmable logic device, discrete gate or transistor logic, discrete hardware components, or any combination thereof designed to perform the functions described herein. A general purpose processor may be a microprocessor, but in the alternative, the at least one processor configured to process information 1010 may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration). The at least one processor configured to process information 1010 can also include software that, when executed, permits the associated hardware of the at least one processor configured to process information 1010 to perform its processing function(s). However, the at least one processor configured to process information 1010 does not correspond to software alone, and the at least one processor configured to process information 1010 relies at least in part upon structural hardware to achieve its functionality. Moreover, the at least one processor configured to process information 1010 may be implicated by language other than "processing", so long as the underlying function corresponds to a processing function. For an example, functions such as evaluating, determining, calculating, identifying, etc., may be performed by the at least one processor configured to process information 1010 in certain contexts as being specific types of processing functions. Other functions that correspond to other types of processing functions may also be performed by the at least one processor configured to process information 1010.

Referring to FIG. 10, the electronics device 1000 further includes memory configured to store information 1015 (e.g., flash memory 120). In an example, the memory configured to store information 1015 can include at least a non-transitory memory and associated hardware (e.g., a memory controller, etc.). For example, the non-transitory memory included in the memory configured to store information 1015 can correspond to RAM, DRAM, flash memory, ROM, erasable programmable ROM (EPROM), EEPROM, registers, hard disk, a removable disk, a CD-ROM, or any other form of storage medium known in the art. The memory configured to store information 1015 can also include software that, when executed, permits the associated hardware of the memory configured to store information 1015 to perform its storage function(s). However, the memory configured to store information 1015 does not correspond to software alone, and the memory configured to store information 1015 relies at least in part upon structural hardware to achieve its functionality. Moreover, the memory configured to store information 1015 may be implicated by language other than "storing", so long as the underlying function corresponds to a storing function. For an example, functions such as caching, maintaining, etc., may be performed by the memory configured to store information 1015 in certain contexts as being specific types of storing functions. Other functions that correspond to other types of storing functions may also be performed by the memory configured to store information 1015.

Referring to FIG. 10, the electronics device 1000 further optionally includes user interface output circuitry configured to present information 1020. In an example, the user interface output circuitry configured to present information 1020 can include at least an output device and associated hardware. For example, the output device can include a video output device (e.g., a display screen, a port that can carry video information such as USB, HDMI, etc.), an audio output device (e.g., speakers, a port that can carry audio information such as a microphone jack, USB, HDMI, etc.), a vibration device and/or any other device by which information can be formatted for output or actually outputted by a user or operator of the electronics device 1000. For example, the user interface output circuitry configured to present information 1020 can include a display. In a further example, the user interface output circuitry configured to present information 1020 can be omitted for certain communications devices, such as network communications devices that do not have a local user (e.g., network switches or routers, remote servers, etc.). The user interface output circuitry configured to present information 1020 can also include software that, when executed, permits the associated hardware of the user interface output circuitry configured to present information 1020 to perform its presentation function(s). However, the user interface output circuitry configured to present information 1020 does not correspond to software alone, and the user interface output circuitry configured to present information 1020 relies at least in part upon structural hardware to achieve its functionality. Moreover, the user interface output circuitry configured to present information 1020 may be implicated by language other than "presenting", so long as the underlying function corresponds to a presenting function. For an example, functions such as displaying, outputting, prompting, conveying, etc., may be performed by the user interface output circuitry configured to present information 1020 in certain contexts as being specific types of presenting functions. Other functions that correspond to other types of storing functions may also be performed by the user interface output circuitry configured to present information 1020.

Referring to FIG. 10, the electronics device 1000 further optionally includes user interface input circuitry configured to receive local user input 1025. In an example, the user interface input circuitry configured to receive local user input 1025 can include at least a user input device and associated hardware. For example, the user input device can include buttons, a touchscreen display, a keyboard, a camera, an audio input device (e.g., a microphone or a port that can carry audio information such as a microphone jack, etc.), and/or any other device by which information can be received from a user or operator of the electronics device 1000. For example, the user interface input circuitry configured to receive local user input 1025 can include buttons, a display (if a touchscreen), etc. In a further example, the user interface input circuitry configured to receive local user input 1025 can be omitted for certain communications devices, such as network communications devices that do not have a local user (e.g., network switches or routers, remote servers, etc.). The user interface input circuitry configured to receive local user input 1025 can also include software that, when executed, permits the associated hardware of the user interface input circuitry configured to receive local user input 1025 to perform its input reception function(s). However, the user interface input circuitry configured to receive local user input 1025 does not correspond to software alone, and the user interface input circuitry configured to receive local user input 1025 relies at least in part upon structural hardware to achieve its functionality. Moreover, the user interface input circuitry configured to receive local user input 1025 may be implicated by language other than "receiving local user input", so long as the underlying function corresponds to a receiving local user function. For an example, functions such as obtaining, receiving, collecting, etc., may be performed by the user interface input circuitry configured to receive local user input 1025 in certain contexts as being specific types of receiving local user functions. Other functions that correspond to other types of receiving local user input functions may also be performed by the user interface input circuitry configured to receive local user input 1025.

Referring to FIG. 10, while the configured structural components of 1005 through 1025 are shown as separate or distinct blocks in FIG. 10 that are implicitly coupled to each other via an associated communication bus (not shown expressly), it will be appreciated that the hardware and/or software by which the respective configured structural components of 1005 through 1025 performs their respective functionality can overlap in part. For example, any software used to facilitate the functionality of the configured structural components of 1005 through 1025 can be stored in the non-transitory memory associated with the memory configured to store information 1015, such that the configured structural components of 1005 through 1025 each performs their respective functionality (i.e., in this case, software execution) based in part upon the operation of software stored by the memory configured to store information 1015. Likewise, hardware that is directly associated with one of the configured structural components of 1005 through 1025 can be borrowed or used by other of the configured structural components of 1005 through 1025 from time to time. For example, the at least one processor configured to process information 1010 can format data into an appropriate format before being transmitted by the transceiver circuitry configured to receive and/or transmit information 1005, such that the transceiver circuitry configured to receive and/or transmit information 1005 performs its functionality (i.e., in this case, transmission of data) based in part upon the operation of structural hardware associated with the at least one processor configured to process information 1010.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the disclosure, it should be noted that various changes and modifications could be made herein without departing from the scope of the disclosure as defined by the appended claims. The functions, steps and/or actions of the method claims in accordance with the embodiments of the disclosure described herein need not be performed in any particular order. Furthermore, although elements of the disclosure may be described or claimed in the singular, the plural is contemplated unless limitation to the singular is explicitly stated.

What is claimed is:

1. A method of operating a host controller for a flash memory, comprising:
monitoring a temperature in a first memory block of the flash memory; and
selectively synchronizing a first refresh of the first memory block with a second refresh of a second memory block of the flash memory based in part upon the monitored temperature.

2. The method of claim 1, further comprising:
determining whether there are any pending Input/Output (I/O) requests for the first memory block, wherein the selectively synchronizing is further based upon the determining.

3. The method of claim 2, wherein the selectively synchronizing synchronizes the first refresh of the first memory block with the second refresh of the second memory block if (i) the monitored temperature is less than or equal to a temperature threshold, and (ii) the determining determines that there are no pending I/O requests for the first memory block.

4. The method of claim 3, wherein the selectively synchronizing synchronizes the first refresh of the first memory block with the second refresh of the second memory block by delaying a start point of a pre-configuration time for the first refresh of the first memory block.

5. The method of claim 2, wherein the selectively synchronizing schedules an immediate refresh of the first memory block if the determining determines there is at least one pending I/O request for the first memory block.

6. The method of claim 1, further comprising:
monitoring an error rate of data read from the first memory block,
wherein the selectively synchronizing schedules an immediate refresh of the first memory block if the monitored error rate exceeds an error rate threshold.

7. The method of claim 6, wherein the error rate threshold is based on an error correction code (ECC) protocol used for data being exchanged between the host controller and the flash memory.

8. The method of claim 1, wherein the selectively synchronizing schedules an immediate refresh of the first memory block if the monitored temperature exceeds a temperature threshold.

9. An apparatus, comprising:
a host controller configured to operate a flash memory via a memory bus, the host controller configured to:
monitor a temperature in a first memory block of the flash memory; and
selectively synchronize a first refresh of the first memory block with a second refresh of a second memory block of the flash memory based in part upon the monitored temperature.

10. The apparatus of claim 9,
wherein the host controller is further configured to determine whether there are any pending Input/Output (I/O) requests for the first memory block, and
wherein the host controller is configured to selectively synchronize the first refresh of the first memory block with the second refresh of the second memory block further based upon the determination.

11. The apparatus of claim 10, wherein the host controller is configured to synchronize the first refresh of the first memory block with the second refresh of the second memory block further if (i) the monitored temperature is less than or equal to a temperature threshold, and (ii) the host controller determines that there are no pending I/O requests for the first memory block.

12. The apparatus of claim 11, wherein the host controller is configured to synchronize the first refresh of the first memory block with the second refresh of the second memory block by delaying a start point of a pre-configuration time for the first refresh of the first memory block.

13. The apparatus of claim 10, wherein the host controller is configured to schedule an immediate refresh of the first memory block if the determining determines there is at least one pending I/O request for the first memory block.

14. The apparatus of claim 9,
wherein the host controller is further configured to monitor an error rate of data read from the first memory block, and
wherein the host controller is configured to schedule an immediate refresh of the first memory block if the monitored error rate exceeds an error rate threshold.

15. The apparatus of claim 14, wherein the error rate threshold is based on an error correction code (ECC) protocol used for data being exchanged between the host controller and the flash memory.

16. The apparatus of claim 9, wherein the host controller is configured to schedule an immediate refresh of the first memory block if the monitored temperature exceeds a temperature threshold.

17. The apparatus of claim 9, further comprising the flash memory and the memory bus.

18. The apparatus of claim 17, wherein the apparatus corresponds to one or more of a computing device, a mobile computing device, a vehicle, an augmented reality (AR) system or a virtual reality (VR) system that incorporates the host controller, the flash memory, and the memory bus.

19. A method of operating a host controller for a flash memory, comprising:
measuring a temperature in a first memory block of the flash memory;
reporting the measured temperature of the flash memory to the host controller via a memory bus; and
selectively executing synchronized refreshes of the first memory block and a second memory block of the flash memory based in part upon the reported temperature.

20. The method of claim 19, wherein the selectively executing executes the synchronized refreshes of the first and second memory blocks
if (i) the reported temperature is less than or equal to a temperature threshold, and (ii) there are no pending I/O requests for the first memory block.

21. The method of claim 20, wherein the selectively executing executes unsynchronized refreshes of the first and second memory blocks if there is at least one pending I/O request for the first memory block.

22. The method of claim 20, wherein the selectively executing executes unsynchronized refreshes of the first and second memory blocks if an error rate of data read from the first memory block exceeds a threshold.

23. The method of claim 22, wherein the error rate threshold is based on an error correction code (ECC) protocol used for data being exchanged between the host controller and the flash memory.

24. The method of claim 19, wherein the selectively executing executes unsynchronized refreshes of the first and second memory blocks if the measured temperature exceeds a temperature threshold.

25. An apparatus, comprising:
a flash memory configured to communicate with a host controller via a memory bus, the flash memory configured to:
  measure a temperature in a first memory block of the flash memory;
  report the measured temperature of the flash memory to the host controller via the memory bus; and
  selectively execute synchronized refreshes of the first memory block and a second memory block of the flash memory based in part upon the reported temperature.

26. The apparatus of claim 25, wherein the flash memory executes the synchronized refreshes of the first and second memory blocks if (i) the reported temperature is less than or equal to a temperature threshold, and (ii) there are no pending I/O requests for the first memory block.

27. The apparatus of claim 25, wherein the flash memory executes unsynchronized refreshes of the first and second memory blocks if there is at least one pending I/O request for the first memory block.

28. The apparatus of claim 25, wherein the flash memory executes unsynchronized refreshes of the first and second memory blocks if an error rate of data read from the first memory block exceeds a threshold.

29. The apparatus of claim 25, wherein the error rate threshold is based on an error correction code (ECC) protocol used for data being exchanged between the host controller and the flash memory.

30. The apparatus of claim 25, wherein the flash memory executes unsynchronized refreshes of the first and second memory blocks if the measured temperature exceeds a temperature threshold.

* * * * *